(12) United States Patent
Goyal (10) Patent No.: US 11,687,428 B2
(45) Date of Patent: Jun. 27, 2023

(54) GLITCH SUPPRESSION APPARATUS AND METHOD

(71) Applicant: STMicroelectronics International N.V., Geneva (CH)

(72) Inventor: Avneep Kumar Goyal, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 206 days.

(21) Appl. No.: 17/152,901

(22) Filed: Jan. 20, 2021

(65) Prior Publication Data

US 2022/0229752 A1 Jul. 21, 2022

(51) Int. Cl.
| | | |
|---|---|---|
| *G06F 11/00* | (2006.01) | |
| *G06F 11/263* | (2006.01) | |
| *G06F 1/06* | (2006.01) | |
| *G06F 11/22* | (2006.01) | |

(52) U.S. Cl.
CPC .............. *G06F 11/263* (2013.01); *G06F 1/06* (2013.01); *G06F 11/2236* (2013.01)

(58) Field of Classification Search
CPC ............... G06F 11/263; G06F 11/2236; G06F 11/0721; G06F 11/0724; G06F 11/1629; G06F 11/1641; G06F 1/06
See application file for complete search history.

(56) References Cited

U.S. PATENT DOCUMENTS

| | | | |
|---|---|---|---|
| 5,537,655 A | 7/1996 | Truong | |
| 5,748,034 A * | 5/1998 | Ketineni | H03K 5/1252 |
| | | | 327/551 |
| 5,892,897 A * | 4/1999 | Carlson | G06F 11/1641 |
| | | | 714/E11.061 |
| 6,393,582 B1 * | 5/2002 | Klecka | G06F 11/1658 |
| | | | 714/10 |
| 8,090,984 B2 | 1/2012 | Moyer et al. | |
| 9,363,071 B2 | 6/2016 | Sengoku et al. | |
| 9,417,946 B2 | 8/2016 | Vilela et al. | |
| 2008/0244305 A1 | 10/2008 | Troppmann et al. | |
| 2019/0391888 A1 | 12/2019 | Meriac et al. | |
| 2020/0019477 A1 | 1/2020 | Jain et al. | |

FOREIGN PATENT DOCUMENTS

| | | |
|---|---|---|
| WO | 2009010321 A1 | 1/2009 |
| WO | 2020016550 A1 | 1/2020 |

\* cited by examiner

*Primary Examiner* — Joseph D Manoskey
(74) *Attorney, Agent, or Firm* — Slater Matsil, LLP (57) ABSTRACT

An apparatus includes a main core processor configured to receive a first signal through a first main buffer, a second signal through a second main buffer, a third signal through a third main buffer and a fourth signal through a fourth main buffer, a shadow core processor configured to receive the first signal through a first shadow buffer, the second signal through a second shadow buffer, the third signal through a third shadow buffer and the fourth signal through a fourth shadow buffer, and a first glitch suppression buffer coupled to a common node of an input of the first main buffer and an input of the first shadow buffer.

20 Claims, 4 Drawing Sheets

GLITCH SUPPRESSION APPARATUS AND METHOD

TECHNICAL FIELD

The present invention relates generally to a glitch suppression apparatus and method in a dual-core lockstep system.

BACKGROUND

As the automotive industry continues to expand, and the volume of automobiles increases, there is a growing need for System-on-Chip (SoC) semiconductor devices designed for safety-critical applications. Reliability is a critical concern for meeting the safety requirements of a range of automotive applications including advanced driver assistance systems, electric power steering systems, adaptive cruise control systems, braking control systems and the like.

In the safety-critical applications, a system error may occur in a computer system. If this system error is not detected and promptly corrected, it may cause hangs and crashes in the computer system. A dual-core lockstep computer system is employed to detect the system error so as to prevent the computer system crashes from occurring.

The dual-core lockstep computer system comprises a main core processor and a shadow core processor configured to operate in lockstep. Both the main core processor and the shadow core processor are configured to receive the same input data and execute the same instruction of a same program code at any given time. After execution of every instruction, the result from the main core processor is compared with the result of the shadow core processor. If any mismatch is found in the results of these two core processors, it indicates there is a fault in the computer system. Consequently, the computer system enters into a defined safe mode.

In the dual-core lockstep computer system, many timing buffers are placed on clock, reset, test signals and data signals. These timing buffers may cause glitches in the dual-core lockstep computer system. The dual-core lockstep computer system is designed to catch the system fault. However, the faults (e.g., single event upset transition faults) occurring on the common paths of the clock, reset and test signals are not detectable. The faults occurring on the common paths may result in reliability issues. It is desirable to have a simple and reliable glitch suppression apparatus to keep the computer system to operate reliably.

SUMMARY

In accordance with an embodiment, an apparatus comprises a main core processor configured to receive a first signal through a first main buffer, a second signal through a second main buffer, a third signal through a third main buffer and a fourth signal through a fourth main buffer, a shadow core processor configured to receive the first signal through a first shadow buffer, the second signal through a second shadow buffer, the third signal through a third shadow buffer and the fourth signal through a fourth shadow buffer, and a first glitch suppression buffer coupled to a common node of an input of the first main buffer and an input of the first shadow buffer.

In accordance with another embodiment, a method comprises placing a first glitch suppression buffer at an end of a first common signal path to suppress glitches of a first signal before the first signal flows into two different signal paths coupled to a main core processor and a shadow core processor, respectively, placing a second glitch suppression buffer at an end of a second common signal path to suppress glitches of a second signal before the second signal flows into two different signal paths coupled to the main core processor and the shadow core processor, respectively, and placing a third glitch suppression buffer at an end of a third common signal path to suppress glitches of a third signal before the third signal flows into two different signal paths coupled to the main core processor and the shadow core processor, respectively.

In accordance with yet another embodiment, a system comprises a plurality of glitch suppression buffers configured to suppress a plurality of glitches of a plurality of signals, each of the plurality of glitch suppression buffers being placed at an end of a common path of a corresponding signal before the corresponding signal is routed to two different paths, a main core processor configured to receive the plurality of signals through a plurality of main buffers, a shadow core processor configured to receive the plurality of signals through a plurality of shadow buffers, and a fault control unit configured to compare an output signal of the main core processor with an output signal of the shadow core processor, and detect whether the output signal of the main core processor matches the output signal of the shadow core processor.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

The present disclosure will be described with respect to preferred embodiments in a specific context, namely a glitch suppression apparatus in a dual-core lockstep system. The present disclosure may also be applied, however, to a variety of safety-critical applications. Hereinafter, various embodiments will be explained in detail with reference to the accompanying drawings.

Figure 1:
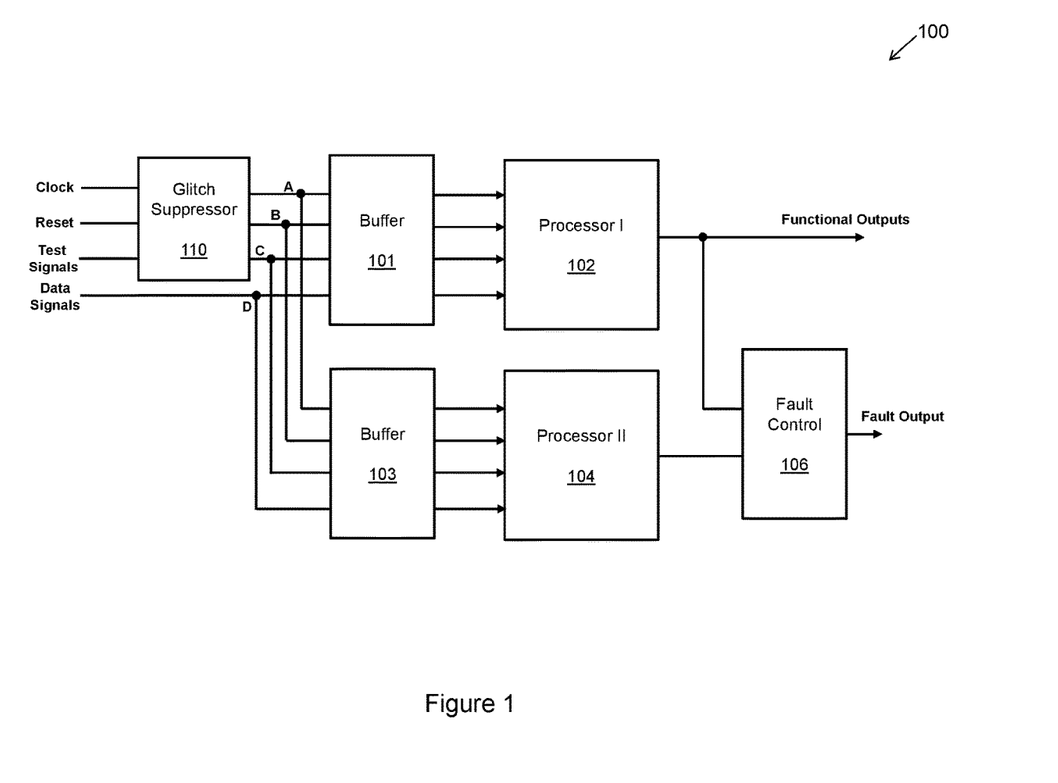
FIG. 1 illustrates a block diagram of a dual-core lockstep system in accordance with various embodiments of the present disclosure.

FIG. 1 illustrates a block diagram of a dual-core lockstep system in accordance with various embodiments of the present disclosure. The dual-core lockstep system 100 comprises a first processor 102, a second processor 104, a first buffer 101, a second buffer 103, a fault control unit 106 and a glitch suppressor 110. The dual-core lockstep system 100 is configured to receive a clock signal, a reset signal, a plurality of test signals and a plurality of data signals. Based on the received signals, the dual-core lockstep system 100 generates a plurality of functional output signals and a fault output signal.

The clock signal is generated by a clock generator (not shown). The clock signal is employed to condition a plurality of intellectual property (IP) components (e.g., communication IP, timer IP and memory IP). It should be noted that FIG. 1 illustrates only one clock signal. It is merely an example. The dual-core lockstep system 100 may include a plurality of clock signals. The clock signal illustrated herein is limited solely for the purpose of clearly illustrating the inventive aspects of the various embodiments.

The reset signal is employed to reset different parts of the dual-core lockstep system 100 before the start of functional operation. It should be noted that FIG. 1 illustrates only one reset signal. It is merely an example. Depending on design needs, the dual-core lockstep system 100 may include a plurality of reset signals.

The test signals are used when the dual-core lockstep system 100 is configured to operate in a test mode. The data signals are used when the dual-core lockstep system 100 is configured to operate in a functional mode. The data signals are generated by a variety of IPs and fed into the first processor 102 and second processor 104, respectively. The first processor 102 processes the data signals and feed the processed data signals to a plurality of IPs connected to the output of the first processor 102.

As shown in FIG. 1, the clock signal flows through a common signal path. At a node A, the clock signal flows into two different signal paths coupled to the first processor 102 and the second processor 104, respectively. Likewise, the reset signal flows through a common signal path. At a node B, the reset signal flows into two different signal paths coupled to the first processor 102 and the second processor 104, respectively. The plurality of test signals flows through a common signal path. At a node C, the plurality of test signals flows into two different signal paths coupled to the first processor 102 and the second processor 104, respectively. The plurality of data signals flows through a common signal path. At a node D, the plurality of data signals flows into two different signal paths coupled to the first processor 102 and the second processor 104, respectively.

In some embodiments, the first processor 102 and the second processor 104 are two identical processors. These two processors are reset in the same states and fed with identical input signals. If these two processors operate correctly, identical outputs are generated by these two processors. In operation, a failure may occur and reach the output of one of these two processors. This failure can be detected by comparing the outputs of the two processors. After detecting such a failure, the dual-core lockstep system wo may take appropriate actions to handle the failure so as to prevent the system from being crashed. In some embodiments, the first processor 102 is configured to perform the system operations. The second processor 104 is configured to confirm the correctness of the operation of the first processor 102. Throughout the description, the first processor 102 may be alternatively referred to as a main core processor 102. The second processor 104 may be referred to as a shadow core processor 104.

The first buffer 101 comprises a plurality of buffers. Depending on design needs, the plurality of buffers is added on different signal paths connected to the main core processor 102. Each buffer of the plurality of buffers may be implemented as two inverters connected in cascade. Throughout the description, the buffers added on the signal paths connected to the main core processor 102 may be alternatively referred to as a plurality of main buffers. The detailed schematic diagram of the first buffer 101 will be described below with respect to FIG. 2.

The second buffer 103 comprises a plurality of buffers. Depending on design needs, the plurality of buffers is added on different signal paths connected to the shadow core processor 104. Each buffer of the plurality of buffers may be implemented as two inverters connected in cascade. Throughout the description, the buffers added on the signal paths connected to the shadow core processor 104 may be alternatively referred to as a plurality of shadow buffers. The detailed schematic diagram of the second buffer 103 will be described below with respect to FIG. 2.

As shown in FIG. 1, the glitch suppressor 110 is placed on the common paths of the clock signal, the reset signal and the test signals. In particular, the glitch suppressor is placed at an end of a common signal path. The glitch suppressor 110 is employed to eliminate glitches occurred on the common signal paths. The detailed schematic diagram of the glitch suppressor 110 will be discussed below with respect to FIGS. 2-3.

The fault control unit 106 comprises a comparison unit. In some embodiments, the comparison unit is implemented as a comparator. The comparison unit has a first input connected to the output of the main core processor 102, and a second input connected to the output of the shadow core processor 104. The fault control unit 106 is configured to compare an output signal of the main core processor 102 with an output signal of the shadow core processor 104, and detect whether the output signal of the main core processor 102 matches the output signal of the shadow core processor 104. If any mismatch is found in the results of these two core processors, there is a fault in the dual-core lockstep system. Consequently, the dual-core lockstep system enters into a defined safe mode.

Figure 2:
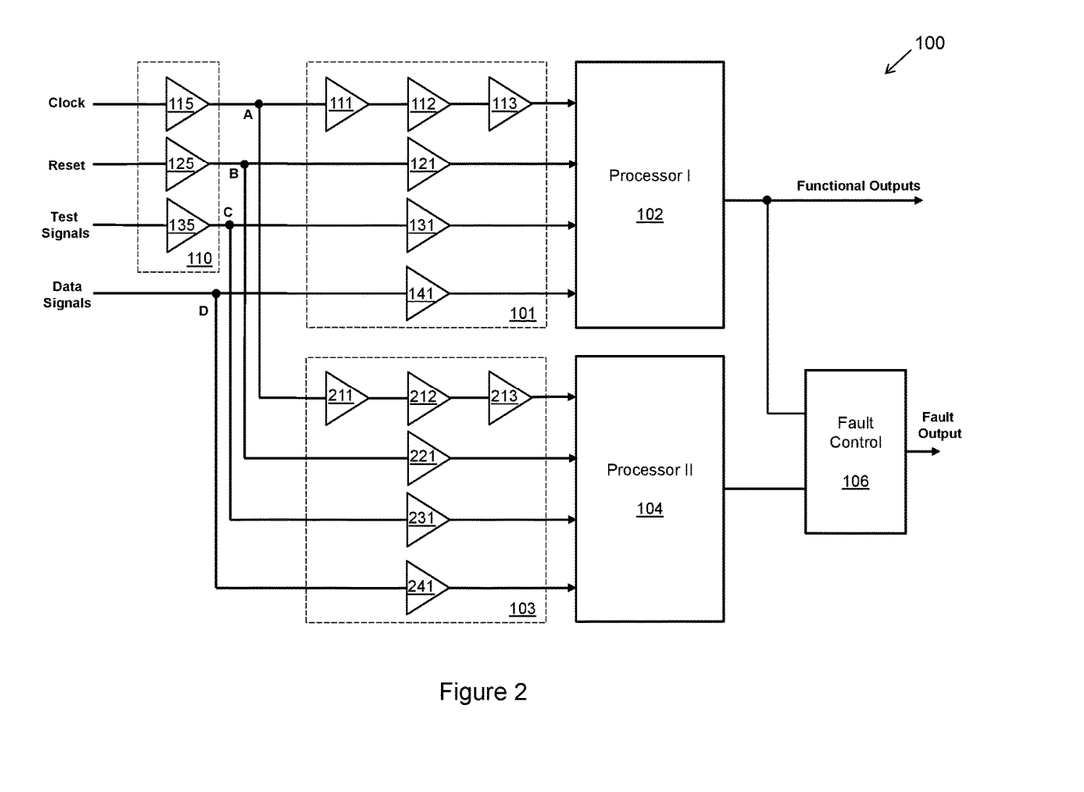
FIG. 2 illustrates a schematic diagram of the dual-core lockstep system shown in FIG. 1 in accordance with various embodiments of the present disclosure.

FIG. 2 illustrates a schematic diagram of the dual-core lockstep system shown in FIG. 1 in accordance with various embodiments of the present disclosure. The glitch suppressor no comprises a plurality of glitch suppression buffers 115, 125 and 135 configured to suppress a plurality of glitches occurred on the clock, reset and test signals. More particularly, a first glitch suppression buffer 115 is employed to suppress the glitches occurred on the clock signal. A second glitch suppression buffer 125 is employed to suppress the glitches occurred on the reset signal. A third glitch suppression buffer 135 is employed to suppress the glitches occurred on the plurality of test signals.

As shown in FIG. 2, the first glitch suppression buffer 115 is placed at an end of a common path of the clock signal before the clock signal is fed into two different paths. At the node A, the clock signal leaves the common path and reaches the main core processor and the shadow core processor through two different paths. As shown in FIG. 2, a first path coupled between the node A and the main core processor 102 comprises buffers 111, 112 and 113. A second path coupled between the node B and the shadow core processor 104 comprises buffers 211, 212 and 213.

At the node B, the reset signal leaves the common path and reaches the main core processor 102 and the shadow core processor 104 through two different paths. As shown in FIG. 2, a first path coupled between the node B and the main core processor 102 comprises a buffer 121. A second path coupled between the node B and the shadow core processor 104 comprises a buffer 221. At the node C, the plurality of test signals leaves the common path and reaches the main core processor 102 and the shadow core processor 104 through two different paths. As shown in FIG. 2, a first path coupled between the node C and the main core processor 102 comprises a buffer 131. A second path coupled between the node C and the shadow core processor 104 comprises a buffer 231.

At the node D, the plurality of data signals leaves the common path and reaches the main core processor 102 and the shadow core processor 104 through two different paths. As shown in FIG. 2, a first path coupled between the node D and the main core processor 102 comprises a buffer 141. A second path coupled between the node D and the shadow core processor 104 comprises a buffer 241.

The buffers (e.g., buffers 111-113, 121, 131, 141, 211-213, 221, 231 and 241) are employed to control the timing of the signals fed into the main core processor 102 and the shadow core processor 104. The buffers may be implemented as two inverters connected in cascade.

One advantageous feature of having the glitch suppression buffers 115, 125 and 135 is that the glitch suppression buffers are added only on the clock, reset and test signal paths. These glitch suppression buffers help to suppress the transition faults that occur on the common signal paths. There are less number of clock, reset and test signals in the input of a dual-core lockstep system in comparison with the data inputs. Adding the glitch suppression buffers only on the clock, reset and test signal paths helps to reduce the semiconductor area of the dual-core lockstep system. Furthermore, in comparison with the conventional glitch suppression apparatus having delay stage flip-flops on all the signal paths, the system shown in FIG. 2 allows to remove delay stage flip-flops, thereby simplifying the system to make it more reliable.

Figure 3:
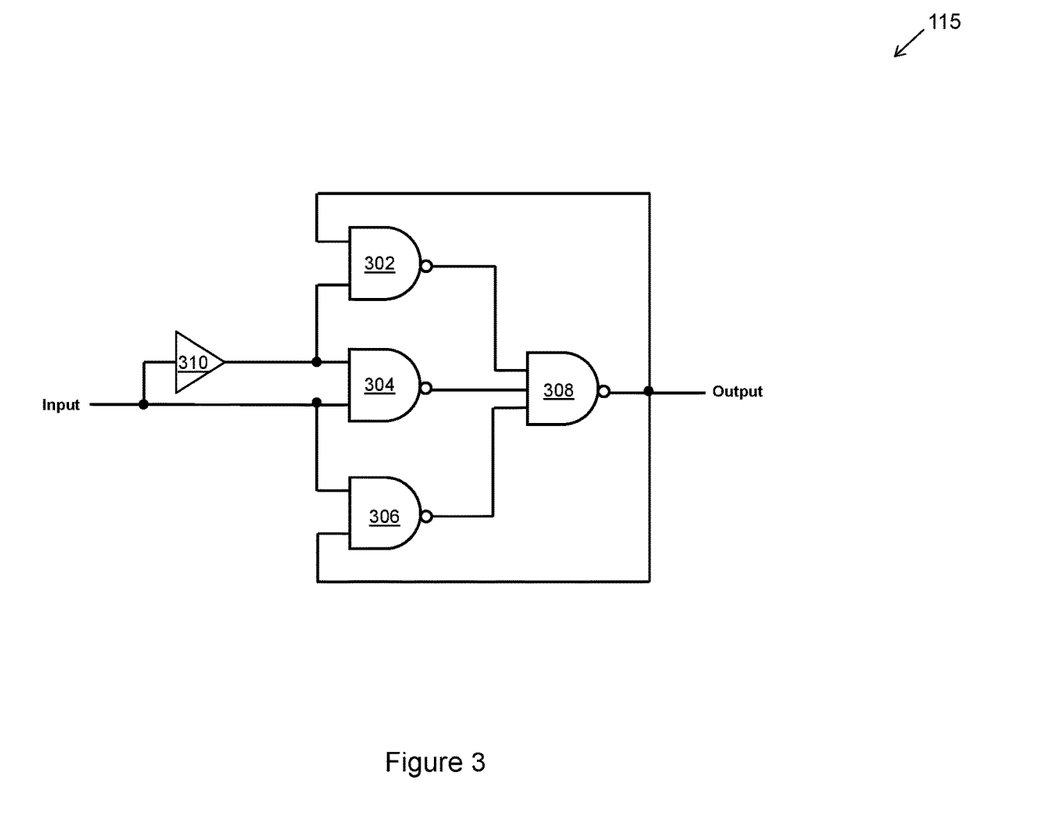
FIG. 3 illustrates a schematic diagram of the glitch suppression buffer shown in FIG. 2 in accordance with various embodiments of the present disclosure.

FIG. 3 illustrates a schematic diagram of the glitch suppression buffer shown in FIG. 2 in accordance with various embodiments of the present disclosure. The glitch suppression buffers 115, 125 and 135 are of a same structure. For simplicity, the glitch suppression buffer 115 is used as an example herein.

As shown in FIG. 3, the glitch suppression buffer 115 comprises a first NAND gate 302, a second NAND gate 304, a third NAND gate 306, a fourth NAND gate 308 and a delay buffer 310.

The first NAND gate 302 has a first input connected to an output of the glitch suppression buffer 115, a second input connected to an output of the delay buffer 310, and an output connected to a first input of the fourth NAND gate 308.

The second NAND gate 304 has a first input connected to the second input of the first NAND gate 302, a second input connected to an input of the glitch suppression buffer 115, and an output connected to a second input of the fourth NAND gate 308.

The third NAND gate 306 has a first input connected to the input of the glitch suppression buffer 115, a second input connected to the output of the glitch suppression buffer 115, and an output connected to a third input of the fourth NAND gate 308.

The fourth NAND gate 308 has a first input connected to the output of the first NAND gate 302, a second input connected to the output of the second NAND gate 304, a third input connected to the output of the third NAND gate 306, and an output connected to the output of the glitch suppression buffer 115.

The delay buffer 310 is connected between the input of the glitch suppression buffer 115 and the first input of the second NAND gate.

In operation, when the input signal of the glitch suppression buffers 115 is of a logic low state, the output of the glitch suppression buffer 115 generates a logic low signal. A glitch (e.g., a logic high glitch) may occur at the input of the glitch suppression buffer 115. The delay buffer 310 delays the incoming glitch and generates a delayed glitch at the output of the delay buffer 310.

At a first time instant, the glitch reaches the second input of the second NAND gate 304 and the first input of the third NAND gate 306. Due to the delay generated by the delay buffer 310, a logic low signal is generated at the output of the delay buffer 310 at the first time instant. This logic low signal is applied to the second input of the first NAND gate 302 and the first input of the second NAND gate 304. As shown in FIG. 3, the output of the glitch suppression buffer 115 is fed into the first input of the first NAND gate 302 and the second input of the third NAND gate 306. According to the operating principle of the NAND gate, the NAND gates 302, 304 and 306 all generate a logic high signal at the first time instant. The fourth NAND gate 308 maintains the logic low state at the first time instant.

After the glitch passes through the glitch suppression buffer 115, at a second time instant, the delayed glitch reaches the second input of the first NAND gate 302 and the first input of the second NAND gate 304. The logic low signal is applied to the first input of the first NAND gate 302, the second input of the second NAND gate 304, the inputs of the third NAND gate 306. According to the operating principle of the NAND gate, the NAND gates 302, 304 and 306 all generate a logic high signal at the first time instant. The fourth NAND gate 308 maintains the logic low state at the second time instant. As such, the glitch is eliminated or absorbed by the glitch suppression buffer 115.

In operation, when the input signal is of a logic high state, the output of the glitch suppression buffer 115 generates a logic high signal. A glitch (e.g., a logic low glitch) may occur at the input of the glitch suppression buffer 115. The glitch suppression buffer 115 is able to eliminate this logic low glitch and maintain the logic high state. The operating principle of eliminating this logic low glitch is similar to that described above, and hence is not discussed herein again.

It should be noted that the glitch suppression buffer shown in FIG. 3 is merely an example, which should not unduly limit the scope of the claims. One of ordinary skill in the art would recognize many variations, alternatives, and modifications.

Figure 4:
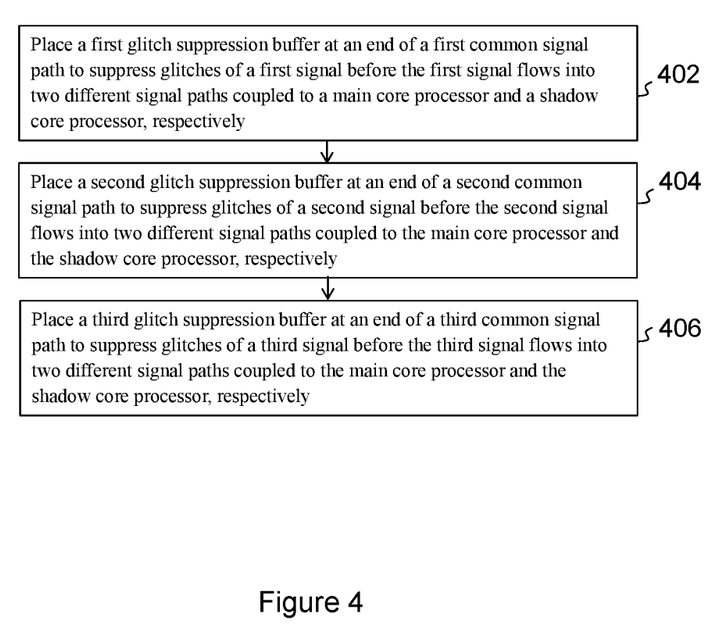
FIG. 4 illustrates a flow chart of a method for suppressing the glitches in the dual-core lockstep system shown in FIG. 1 in accordance with various embodiments of the present disclosure.

FIG. 4 illustrates a flow chart of a method for suppressing the glitches in the dual-core lockstep system shown in FIG. 1 in accordance with various embodiments of the present disclosure. This flowchart shown in FIG. 4 is merely an example, which should not unduly limit the scope of the claims. One of ordinary skill in the art would recognize many variations, alternatives, and modifications. For example, various steps illustrated in FIG. 4 may be added, removed, replaced, rearranged and repeated.

A dual-core lockstep system comprises a main core processor (e.g., processor I in FIGS. 1-2) and a shadow core processor (e.g., processor II in FIGS. 1-2). Both the main core processor and the shadow core processor are configured to receive the same input signals including a clock signal, a reset signal, a plurality of test signals and a plurality of data signals.

The clock signal flows through a common clock signal path. At a first node (e.g., node A in FIGS. 1-2), the clock signal is routed to two different signal paths connected to the main core processor and the shadow core processor, respectively. For controlling the timing of the clock signal fed into the main core processor, a plurality of first main buffers (e.g., buffers 111, 112 and 113 in FIG. 2) is placed in the signal path between the first node and the main core processor. For controlling the timing of the clock signal fed into the shadow core processor, a plurality of first shadow buffers (e.g., buffers 211, 212 and 213 in FIG. 2) is placed in the signal path between the first node and the shadow core processor.

The reset signal flows through a common reset signal path. At a second node (e.g., node B in FIGS. 1-2), the reset signal is routed to two different signal paths connected to the main core processor and the shadow core processor, respectively. For controlling the timing of the reset signal fed into the main core processor, a second main buffer (e.g., buffer 121 in FIG. 2) is placed in the signal path between the second node and the main core processor. For controlling the timing of the reset signal fed into the shadow core processor, a second shadow buffer (e.g., buffer 221 in FIG. 2) is placed in the signal path between the second node and the shadow core processor.

The plurality of test signals flows through a common test signal path. At a third node (e.g., node C in FIGS. 1-2), the plurality of test signals is routed to two different signal paths connected to the main core processor and the shadow core processor, respectively. For controlling the timing of the plurality of test signals fed into the main core processor, a third main buffer (e.g., buffer 131 in FIG. 2) is placed in the signal path between the third node and the main core processor. For controlling the timing of the plurality of test signals fed into the shadow core processor, a third shadow buffer (e.g., buffer 231 in FIG. 2) is placed in the signal path between the third node and the shadow core processor.

The plurality of data signals flows through a common data signal path. At a fourth node (e.g., node D in FIGS. 1-2), the plurality of data signals is routed to two different signal paths connected to the main core processor and the shadow core processor, respectively. For controlling the timing of the plurality of data signals fed into the main core processor, a fourth main buffer (e.g., buffer 141 in FIG. 2) is placed in the signal path between the fourth node and the main core processor. For controlling the timing of the plurality of data signals fed into the shadow core processor, a fourth shadow buffer (e.g., buffer 241 in FIG. 2) is placed in the signal path between the fourth node and the shadow core processor.

Both the main core processor and the shadow core processor process the received signals. The output of the main core processor is compared with the output of the shadow core processor at a fault control unit (e.g., fault control unit 106 shown in FIGS. 1-2). The fault control unit determines whether the output signal of the main core processor matches the output signal of the shadow core processor. If the outputs of these core processors do not match to each other, it indicates there is a fault in the dual-core lockstep system. The dual-core lockstep system enters into a predetermined safe mode to prevent the propagation of the fault.

In operation, glitches may occur in the common signal paths. The conventional dual-core configuration cannot detect the glitches because the glitches are fed into both the main core processor and the shadow simultaneously. The following steps are employed to suppress the glitches occurred in the common signal paths.

At step 402, a first glitch suppression buffer (e.g., first glitch suppression buffer 115 shown in FIG. 2) is placed at an end of a first common signal path to suppress glitches of a first signal before the first signal flows into two different signal paths coupled to a main core processor and a shadow core processor, respectively. The first signal is the clock signal. The first common signal path is a common clock signal path. The first glitch suppression buffer is placed at an end of the common clock signal path before the clock signal is routed to the two different signal paths.

At step 404, a second glitch suppression buffer (e.g., second glitch suppression buffer 125 shown in FIG. 2) is placed at an end of a second common signal path to suppress glitches of a second signal before the second signal flows into two different signal paths coupled to the main core processor and the shadow core processor, respectively. The second signal is the reset signal. The second common signal path is a common reset signal path. The second glitch suppression buffer is placed at an end of the common reset signal path before the reset signal is routed to the two different signal paths.

At step 406, a third glitch suppression buffer (e.g., third glitch suppression buffer 135 shown in FIG. 2) is placed at an end of a third common signal path to suppress glitches of a third signal before the third signal flows into two different signal paths coupled to the main core processor and the shadow core processor, respectively. The third signal comprises a plurality of test signals. The third common signal path is a common test signal path. The third glitch suppression buffer is placed at an end of the common test signal path before the plurality of test signals is routed to the two different signal paths.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a main core processor configured to receive a first signal through a first main buffer, a second signal through a second main buffer, a third signal through a third main buffer and a fourth signal through a fourth main buffer;
a shadow core processor configured to receive the first signal through a first shadow buffer, the second signal through a second shadow buffer, the third signal through a third shadow buffer and the fourth signal through a fourth shadow buffer; and
a first glitch suppression buffer coupled to a common node of an input of the first main buffer and an input of the first shadow buffer.

2. The apparatus of claim 1, herein
the first signal is a clock signal.

3. The apparatus of claim 1, further comprising:
a second glitch suppression buffer coupled to a common node of an input of the second main buffer and an input of the second shadow buffer.

4. The apparatus of claim 3, wherein:
the second signal is a reset signal.

5. The apparatus of claim 1, further comprising:
a third glitch suppression buffer coupled to a common node of an input of the third main buffer and an input of the third shadow buffer.

6. The apparatus of claim 5, wherein:
the third signal comprises a plurality of test signals.

7. The apparatus of claim 1, wherein:
the fourth signal comprises a plurality of data signals.

8. The apparatus of claim 1, wherein the first glitch suppression buffer comprises:
a first NAND gate having a first input connected to an output of the first glitch suppression buffer;
a second NAND gate having a first input connected to a second input of the first NAND gate, and a second input connected to an input of the first glitch suppression buffer;
a third NAND gate having a first input connected to the input of the first glitch suppression buffer, and a second input connected to the output of the first glitch suppression buffer;
a fourth NAND gate having a first input connected to an output of the first NAND gate, a second input connected to an output of the second NAND gate, a third input connected to an output of the third NAND gate, and an output connected to the output of the first glitch suppression buffer; and
a delay buffer connected between the input of the first glitch suppression buffer and the first input of the second NAND gate.

9. The apparatus of claim 1, further comprising:
a comparator having a first input coupled to an output of the main core processor, and a second input coupled to an output of the shadow core processor, wherein the comparator is configured to compare an output signal of the main core processor with an output signal of the shadow core processor, and detect whether the output signal of the main core processor matches the output signal of the shadow core processor.

10. The apparatus of claim 1, wherein:
the first glitch suppression buffer is placed at an end of a common path of the first signal before the first signal is routed to two different signal paths connected to the main core processor and the shadow core processor, respectively.

11. A method comprising:
placing a first glitch suppression buffer at an end of a first common signal path to suppress glitches of a first signal before the first signal flows into two different signal paths coupled to a main core processor and a shadow core processor, respectively;
placing a second glitch suppression buffer at an end of a second common signal path to suppress glitches of a second signal before the second signal flows into two different signal paths coupled to the main core processor and the shadow core processor, respectively; and
placing a third glitch suppression buffer at an end of a third common signal path to suppress glitches of a third signal before the third signal flows into two different signal paths coupled to the main core processor and the shadow core processor, respectively.

12. The method of claim 11, further comprising:
delaying the first signal by adding a plurality of first main buffers between an output of the first glitch suppression buffer and the main core processor, the first signal being a clock signal;
delaying the second signal by adding at least one second main buffer between an output of the second glitch suppression buffer and the main core processor, the second signal being a reset signal; and
delaying the third signal by adding at least one third main buffer between an output of the third glitch suppression buffer and the main core processor, the third signal comprising a plurality of test signals.

13. The method of claim 11, wherein:
delaying the first signal by adding a plurality of first shadow buffers between an output of the first glitch suppression buffer and the shadow core processor, wherein the first signal is a clock signal;
delaying the second signal by adding at least one second shadow buffer between an output of the second glitch suppression buffer and the shadow core processor, wherein the second signal is a reset signal; and
delaying the third signal by adding at least one third shadow buffer between an output of the third glitch suppression buffer and the shadow core processor, wherein the third signal comprises a plurality of test signals.

14. The method of claim 11, further comprising:
delaying a plurality of data signals by adding at least one fourth main buffer between the main core processor and an end of a common data signal path before the plurality of data signals is routed to two different signal paths coupled to the main core processor and the shadow core processor, respectively; and
delaying the plurality of data signals by adding at least one fourth shadow buffer between the shadow core processor and the end of the common data signal path.

15. The method of claim 11, wherein the first glitch suppression buffer comprises:
a first NAND gate having a first input connected to an output of the first glitch suppression buffer;
a second NAND gate having a first input connected to a second input of the first NAND gate, and a second input connected to an input of the first glitch suppression buffer;

a third NAND gate having a first input connected to the input of the first glitch suppression buffer, and a second input connected to the output of the first glitch suppression buffer;

a fourth NAND gate having a first input connected to an output of the first NAND gate, a second input connected to an output of the second NAND gate, a third input connected to an output of the third NAND gate, and an output connected to the output of the first glitch suppression buffer; and a delay buffer connected between the input of the first glitch suppression buffer and the first input of the second NAND gate.

16. The method of claim 11, further comprising:

comparing an output signal of the main core processor with an output signal of the shadow core processor; and detecting whether the output signal of the main core processor matches the output signal of the shadow core processor based on a comparing result of the step of comparing the output signal of the main core processor with the output signal of the shadow core processor.

17. A system comprising:

a plurality of glitch suppression buffers configured to suppress a plurality of glitches of a plurality of signals, each of the plurality of glitch suppression buffers being placed at an end of a common path of a corresponding signal before the corresponding signal is routed to two different paths;

a main core processor configured to receive the plurality of signals through a plurality of main buffers;

a shadow core processor configured to receive the plurality of signals through a plurality of shadow buffers; and a fault control unit configured to compare an output signal of the main core processor with an output signal of the shadow core processor, and detect whether the output signal of the main core processor matches the output signal of the shadow core processor.

18. The system of claim 17, wherein:

the main core processor is configured to receive a clock signal through a first glitch suppression buffer, a reset signal through a second glitch suppression buffer, test signals through a third glitch suppression buffer; and the shadow core processor is configured to receive the clock signal through the first glitch suppression buffer, the reset signal through the second glitch suppression buffer, the test signals through the third glitch suppression buffer.

19. The system of claim 17, wherein one glitch suppression buffer of the plurality of glitch suppression buffers comprises:

a first NAND gate having a first input connected to an output of the one glitch suppression buffer;

a second NAND gate having a first input connected to a second input of the first NAND gate, and a second input connected to an input of the one glitch suppression buffer;

a third NAND gate having a first input connected to the input of the one glitch suppression buffer, and a second input connected to the output of the one glitch suppression buffer;

a fourth NAND gate having a first input connected to an output of the first NAND gate, a second input connected to an output of the second NAND gate, a third input connected to an output of the third NAND gate, and an output connected to the output of the one glitch suppression buffer; and a delay buffer connected between the input of the one glitch suppression buffer and the first input of the second NAND gate.

20. The system of claim 17, wherein:

the main core processor, the shadow core processor and the fault control unit form a dual-core lockstep system.

* * * * *

UNITED STATES PATENT AND TRADEMARK OFFICE
CERTIFICATE OF CORRECTION

PATENT NO. : 11,687,428 B2
APPLICATION NO. : 17/152901
DATED : June 27, 2023
INVENTOR(S) : Goyal It is certified that error appears in the above-identified patent and that said Letters Patent is hereby corrected as shown below:

In the Claims

In Column 9, in Claim 2, Line 22, delete "herein" and insert -- wherein: --.

Signed and Sealed this
Twelfth Day of September, 2023

Katherine Kelly Vidal
*Director of the United States Patent and Trademark Office*